(12) United States Patent
Tseng

(10) Patent No.: US 7,881,067 B2
(45) Date of Patent: Feb. 1, 2011

(54) CIRCUIT BOARD ASSEMBLY

(75) Inventor: Fu-Yen Tseng, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 548 days.

(21) Appl. No.: 11/861,661

(22) Filed: Sep. 26, 2007

(65) Prior Publication Data
US 2008/0266823 A1 Oct. 30, 2008

(30) Foreign Application Priority Data
Apr. 27, 2007 (CN) .................. 2007 1 0200532

(51) Int. Cl.
*H05K 7/00* (2006.01)
(52) U.S. Cl. ...................................... 361/760
(58) Field of Classification Search .............. 361/760; 257/698, 686
See application file for complete search history.

(56) References Cited

U.S. PATENT DOCUMENTS

| | | | |
|---|---|---|---|
| 4,953,005 A | * | 8/1990 | Carlson et al. ............. 257/666 |
| 6,062,911 A | * | 5/2000 | Davis et al. ................ 439/630 |
| 6,861,746 B1 | | 3/2005 | Waldvogel et al. |
| 2006/0007661 A1 | | 1/2006 | Iketaki |

FOREIGN PATENT DOCUMENTS

| | | |
|---|---|---|
| JP | 7050465 | 2/1995 |
| TW | 200524493 A | 7/2005 |

* cited by examiner

*Primary Examiner*—Jinhee J Lee
*Assistant Examiner*—Abiy Getachew
(74) *Attorney, Agent, or Firm*—Jeffrey T. Knapp

(57) ABSTRACT

A circuit board assembly (100) includes a circuit board (10) and at least one electrical element (20). The circuit board includes a dielectric substrate (12) including a supporting surface (13), and at least one connecting part (14) formed on the supporting surface. The at least one electrical element is electrically connected to the at least one connecting part via a connecting media (28). At least one air-exhaust hole (16) extends through the connecting part and the dielectric substrate. The at least one air-exhaust hole is configured for exhausting air from the connecting media.

7 Claims, 5 Drawing Sheets

CIRCUIT BOARD ASSEMBLY

BACKGROUND

1. Field of the Invention

The present invention relates to circuit board assemblies and, more particularly, to a circuit board assembly with improvement of solder-open defects.

2. Description of Related Art

Nowadays, electrical connections used in circuit board assemblies mainly include soldering connections and conductive-adhesive connections. Weld connection parts such as soldering spots are preformed on a circuit board assembly, and electrical elements are fixed on the soldering spots by solder, the circuit board assembly with the electrical elements are then transferred to a high-temperature furnace to be heated. The solder is melted so as to form electrical connections between the electrical elements and the circuit board. Adhesive connecting parts such as gilt layers are preformed on the circuit board, and the electrical elements are attached to the connecting part by conductive adhesives, then the circuit board assembly with the electrical elements are heated to solidify the conductive adhesive. In this way, electrical connections are formed between the electrical elements and the circuit board.

However, poorly applied gilding or scuffing of the connecting part may occur. As a result recesses may be formed on the connecting part due to the scuffing of the connecting part. During assembling the circuit board assembly, air may be trapped in the recesses. This leads to bad contact states or solder-open defects. A solder-open defect is a condition where there is too little or no solder at an intended solder joint to form a proper connection.

What is needed, therefore, is to provide a circuit board assembly with improvement of solder-open defects.

SUMMARY

In a present embodiment, a circuit board assembly includes a circuit board and at least one electrical element. The circuit board includes a dielectric substrate including a supporting surface, and at least one connecting part formed on the supporting surface. The at least one electrical element is electrically connected to the at least one connecting part via a connecting media. At least one air-exhaust hole extends through the connecting part and the dielectric substrate. The at least one air-exhaust hole is configured for exhausting air from the connecting media.

Advantages and novel features will become more apparent from the following detailed description of the present circuit board assembly, when taken in conjunction with the accompanying drawings.

BRIEF DESCRIPTION OF THE DRAWINGS

Many aspects of the present circuit board assembly can be better understood with reference to the following drawings. The components in the drawings are not necessarily drawn to scale, the emphasis instead being placed upon clearly illustrating the principles of the present circuit board assembly. Moreover, in the drawings, like reference numerals designate corresponding parts throughout the several views.

Figure 1:
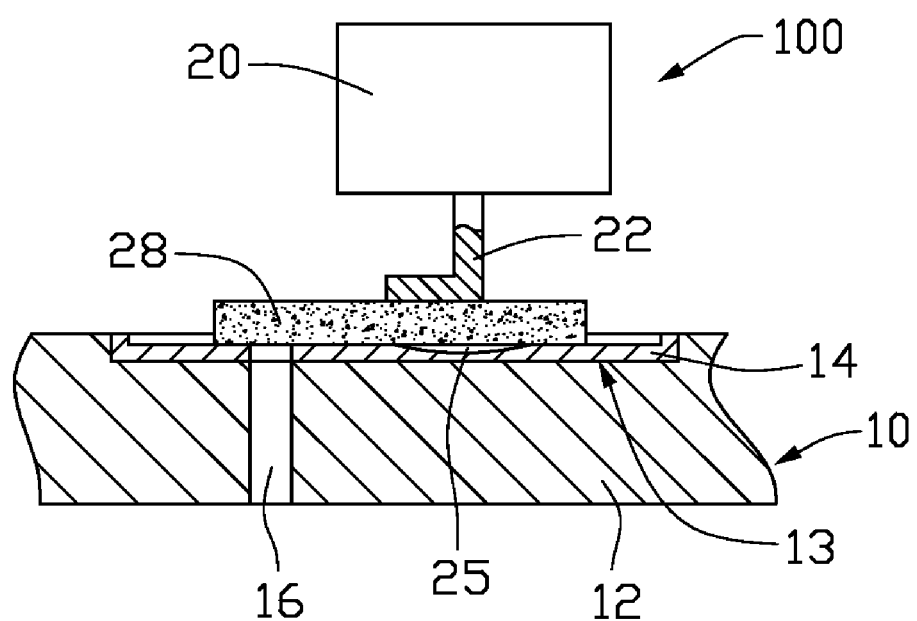
FIG. 1 is a schematic cross-section view of a circuit board assembly according to a first present embodiment.

Corresponding reference characters indicate corresponding parts throughout the drawings. The exemplifications set out herein illustrate at least one present embodiment of the present circuit board assembly, in one form, and such exemplifications are not to be construed as limiting the scope of the invention in any manner.

DETAILED DESCRIPTION OF THE INVENTION

Reference will now be made to the drawings to describe present embodiments of a circuit board assembly.

Figure 2:
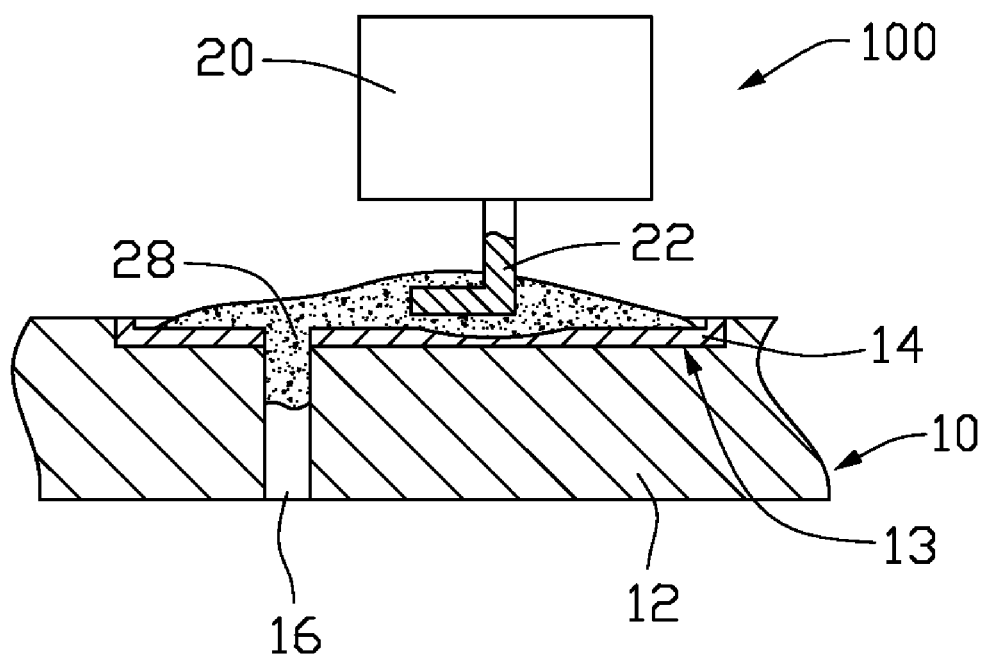
FIG. 2 is a schematic cross-section view of the assembled circuit board assembly shown in FIG. 1.

Referring to FIGS. 1 and 2, a circuit board assembly 100 according to a first present embodiment is shown. The circuit board assembly 100 includes a circuit board 10, an electrical element 20 and a connecting media 28. The electrical element 20 is electrically connected to the circuit board 10 via the connecting media 28. Material of the connecting media 28 is a soldering material or a conductive adhesive. In this present embodiment, the connecting media 28 is a soldering material.

The electrical element 20 includes at least one connecting pin 22. The at least one connecting pin 22 is inserted into the connecting media 28 for a good electrical-contact state between the circuit board 10 and the electrical element 20. The material of the at least one connecting pin 22 can be a metal, such as gold or copper. In this present embodiment, the electrical element 20 may be a resistor, a capacitor, an image sensor, etc.

The circuit board 10 includes a dielectric substrate 12 and a connecting part 14. The dielectric substrate 12 includes a cavity and a supporting surface 13 communicating with the cavity. The connecting part 14 is received in the cavity and supported on the supporting surface 13 of the dielectric substrate 12. The connecting pin 22 of the electrical element 20 is electrically connected to the connecting part 14 of the circuit board 10 by the connecting media 28.

In this present embodiment, the connecting part 14 is received within the cavity without extending out of the cavity. Material of the connecting part 14 is gold. Alternatively, the connecting part 14 may extend out of the cavity. The connecting part 14 may be a multi-layer metallic layer including a copper layer formed on the supporting surface 13, a nickel layer formed on the copper layer and a gold layer formed in series on the nickel layer.

The connecting part 14 is provided with an air-exhaust hole 16 extending through the connecting part 14 and the dielectric substrate 12. A diameter of the air-exhaust hole 16 is approximately 1 millimeter. The air-exhaust hole 16 is configured for exhausting air from the connecting media 28.

Generally, a recess 25 may be formed on the connecting part 14 due to bad gilts or scuffs of the connecting part 14. During assembling the circuit board assembly 100, air may be accommodated in the recess 25. This leads to bad contact states or solder-open defects. A solder-open defect is a condition where there is too little or no solder at an intended solder joint to form a proper connection.

Referring to FIG. 2 again, when soldering the electrical element 20 to the connecting part 14, a reflowed process is used so as to make the connecting pin 22 attach to the connecting part 14 by the connecting media 28. Therefore, the electrical element 20 is firmly fixed and electrically connected to the connecting part 14. Air accommodated in the recess 25 is expelled out of the circuit board assembly 100 via the air-exhaust hole 16 and the recess 25 is filled by the connecting media 28. Therefore, the bad contact states or the solder-open defects can be prevented. Accordingly, a compact electrical connection between the electrical element 20 and the circuit board assembly 100 is maintained.

Further, an excessive connecting media 28 may lead to solder-short defects. A solder-short defect is a condition where two adjacent electrical contacts, which are not intended to be connected, are connected due to excess application of solder. The air-exhaust hole 16 may accommodate the excessive connecting media 28 thus preventing solder-short defect.

It is understood that the connecting media 28 may be a conductive adhesive. The number of the air-exhaust holes 16 may be two or more, depending on requirements.

Figure 3:
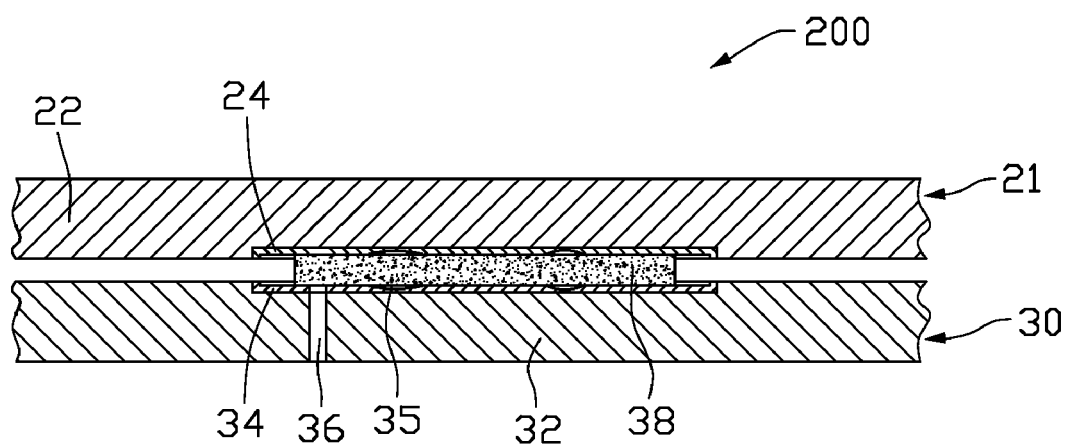
FIG. 3 is a schematic cross-section view of a circuit board assembly according to a second present embodiment.
Figure 4:
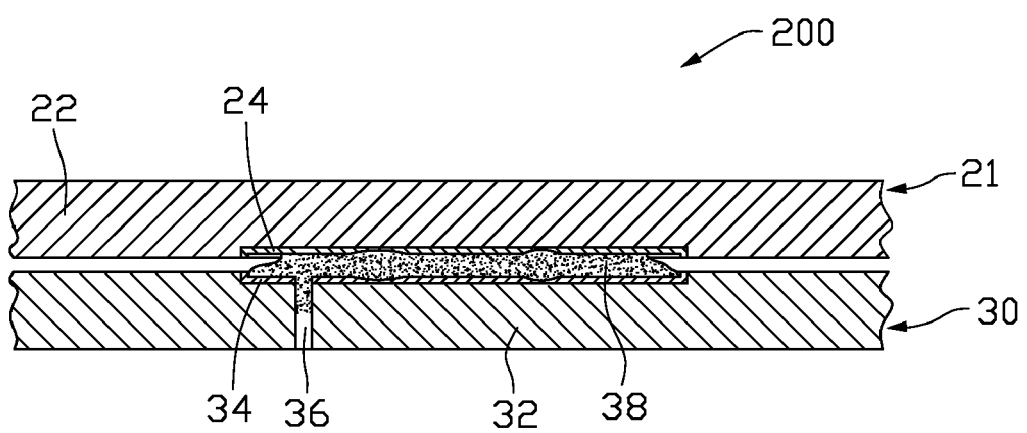
FIG. 4 is a schematic cross-section view of the assembled circuit board assembly shown in FIG. 3.

Referring to FIGS. 3 and 4, a circuit board assembly 200 according to a second present embodiment is shown. Differences between the circuit board assembly 200 and the circuit board assembly 100 include the circuit board assembly 200 having a first circuit board 21 and a second circuit board 30. The electrical element 20 is electrically connected to the first circuit board 21, and the first circuit board 21 is electrically connected to the second circuit board 30.

At least one of the first circuit board 21 and the second board 30 has a structure similar to that of the circuit board 10 in the first embodiment. In the present embodiment, the second circuit board 30 has a structure similar to that of the circuit board 10 described in the first present embodiment.

The first circuit board 21 includes a first dielectric substrate 22 and a first connecting part 24 formed on the dielectric substrate 22. The second circuit board 30 includes a second dielectric substrate 32 and a second connecting part 34 formed on the second dielectric substrate 32. The first connecting part 24 of the first circuit board 21 correspondingly faces the second connecting part 34 of the second circuit board 30. The second circuit board 30 is provided with at least one air-exhaust hole 36. The at least one air-exhausting hole 36 extends through the second connecting part 34 and the second dielectric substrate 32 and is configured for exhausting air trapped in the recess 35. A connecting media 38 is positioned between the first connecting part 24 of the first circuit board 21 and the second connecting part 34 of the second circuit board 30.

The advantages of the circuit board assembly 200 of the second present embodiment are similar to that of the circuit board assembly 100 of the first second present embodiment.

Figure 5:
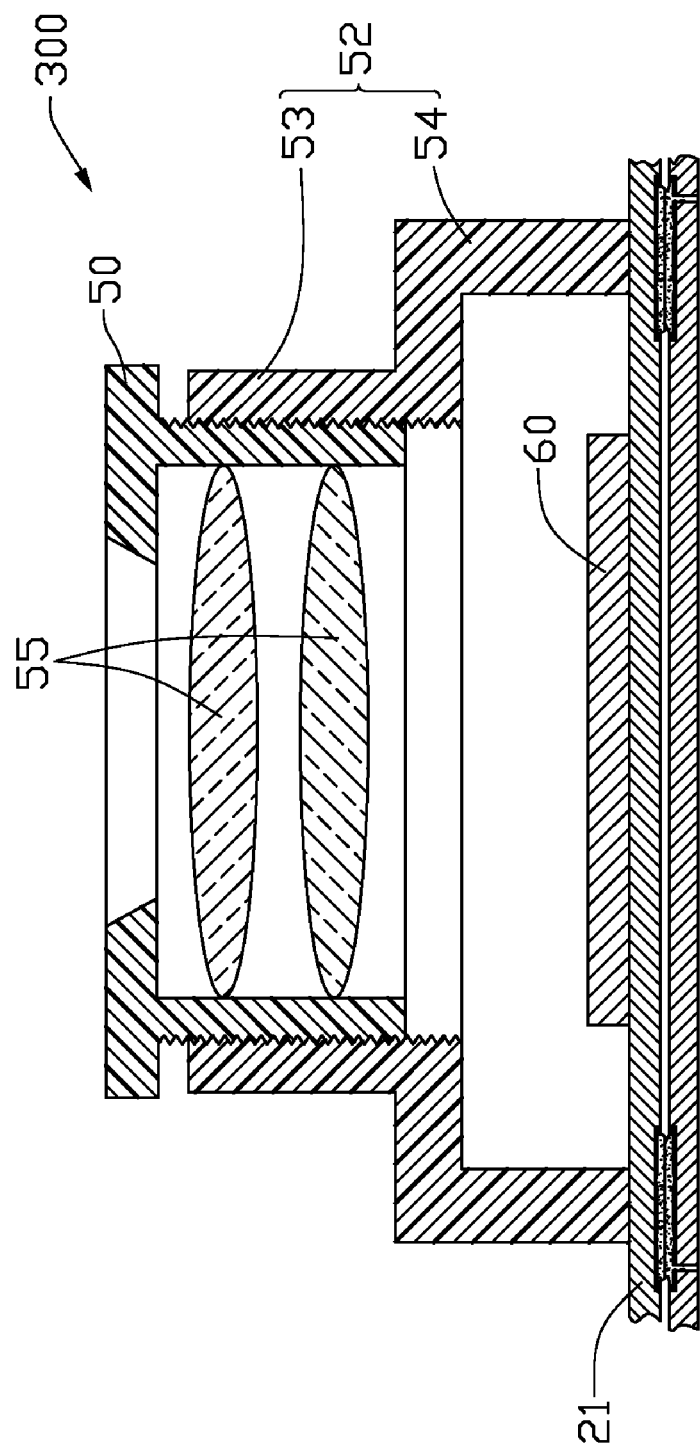
FIG. 5 is a schematic cross-section view of an electrical element according to the second present embodiment.

Referring to FIG. 5, a camera module 300 is taken as an example of the electrical element 20 used in the second present embodiment. The camera module 300 includes a lens barrel 50, a holder 52, and an image chip 60. The image chip 60 is electrically connected to the first circuit board 21 of the circuit board assembly 200 according to the second present embodiment. Pins (not shown) of the image chip 60 acting as the connecting pins 22 of the electrical element 20 are soldered to the connecting parts 24 and 34 by the connecting media 38. A lens group 55 is received in the lens barrel 50. The holder 52 has a first end 53 and a second end 54. The lens barrel 50 is engaged with the first end 53 of the holder 52. The second end 54 of the holder is attached to the first circuit board 21.

Understandably, the camera module 300 can also be attached to the circuit board 10 according to the first embodiment.

The above-described example of the electrical element 20 is made for better understanding of the present invention. Variations may be made to the example without departing from the spirit of the present invention as claimed.

Since the connecting part is provided with an air-exhaust hole through the connecting part and the dielectric substrate, air trapped in the recess can flow out of the circuit board assembly via the air-exhaust hole. Therefore, poor contact or the solder-open defects can effectively be eliminated so that a compact electrical connection between the electrical element and the circuit board assembly is maintained. Further, the air-exhaust hole may accommodate the excessive connecting media and thus also improve the solder-short defect.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A circuit board assembly comprising:
   a circuit board, the circuit board including a dielectric substrate including a supporting surface and at least one connecting part formed on the supporting surface, a recess formed on the at least one connecting part; and
   at least one electrical element electrically connected to the at least one connecting part via a connecting media, at least one air-exhaust hole extending through the connecting part and the dielectric substrate to communicate with the connecting media, wherein the recess is filled with the connecting media, the at least one air-exhaust hole exhausts air accumulated between the connecting media and the recess of the at least one connecting part, after the air is exhausted through the at least one air-exhaust hole, the connecting media seals the at least one air-exhaust hole.

2. The circuit board assembly as claimed in claim 1, wherein the at least one connecting part is a gold layer formed on the supporting surface.

3. The circuit board assembly as claimed in claim 1, wherein the at least one connecting part is a multi-layer metallic layer including a copper layer formed on the supporting surface, a nickel layer formed on the copper layer and a gold layer formed on the nickel layer.

4. The circuit board assembly as claimed in claim 1, wherein the connecting media is a soldering material or a conductive adhesive.

5. The circuit board assembly as claimed in claim 1, wherein the dielectric substrate defines a cavity where the supporting surface is formed, and the at least one connecting part is received in the cavity and extends out of the cavity.

6. The circuit board assembly as claimed in claim 1, wherein the dielectric substrate defines a cavity, the connecting part is completely received within the cavity.

7. The circuit board assembly as claimed in claim 1, wherein the at least one electrical element comprises a connecting pin, and the connecting pin is inserted into the connecting media for maintaining a good electrical-contact state between the circuit board and the at least one electrical element.

* * * * *